United States Patent [19]

Maserjian

[11] Patent Number: 5,132,763
[45] Date of Patent: Jul. 21, 1992

[54] INAS HOLE-IMMOBILIZED DOPING SUPERLATTICE LONG-WAVE-INFRARED DETECTOR

[75] Inventor: Joseph Maserjian, Valencia, Calif.

[73] Assignee: The United States of America as represented by the Administrator of the National Aeronautics and Space Administration, Washington, D.C.

[21] Appl. No.: 651,882

[22] Filed: Feb. 7, 1991

[51] Int. Cl.⁵ .................. H01L 29/205; H01L 31/10
[52] U.S. Cl. ........................ 357/30; 357/4; 357/16
[58] Field of Search ...................... 357/4, 16, 30

[56] References Cited

U.S. PATENT DOCUMENTS

| | | | |
|---|---|---|---|
| H,95 | 7/1986 | Shanabrook et al. | 357/30 |
| 4,348,686 | 9/1982 | Esaki et al. | 357/30 |
| 4,525,687 | 6/1985 | Chemla et al. | 332/7.51 |
| 4,607,272 | 8/1986 | Osbourn | 357/30 |
| 4,616,241 | 10/1986 | Biefeld et al. | 357/16 |
| 4,679,061 | 7/1987 | Capasso et al. | 357/4 |
| 4,785,340 | 11/1988 | Nakagawa et al. | 357/35 |
| 4,794,439 | 12/1988 | Webb et al. | 357/30 |
| 4,803,537 | 2/1988 | Lewis et al. | 357/30 |
| 4,806,993 | 2/1989 | Voisin et al. | 357/4 |
| 4,807,007 | 2/1989 | Borello et al. | 357/30 |
| 4,819,036 | 4/1989 | Kuroda et al. | 357/4 |
| 4,839,714 | 6/1989 | Doehler et al. | 357/71 |
| 4,883,770 | 11/1989 | Doehler et al. | 437/110 |
| 4,899,200 | 2/1990 | Shur et al. | 357/30 |

FOREIGN PATENT DOCUMENTS 61-292973 12/1986 Japan .................... 357/30

OTHER PUBLICATIONS

Soderstrom et al., *IEEE Elec. Dev. Lett.* vol. 11 No. 1 Jan. 1990 "InAs/AlSb . . . Devices" pp. 27-29.
Glass et al., *Appl Phys Lett* 54(22), May 29, 1989 "Novel . . . structure" pp. 2247-2249.
Hodge et al., *Semi Sci. Technol* (5) 1990 S319-S322 "NiPi . . . fabrication".
Kurtz et al., *IEEE Elect. Dev Letts* vol. 11, No. 1 Jan 1990 pp. 54-56.
Kurtz et al., Appl. Phys. Letts. 52 (19)May 9, 1988 "Demonstration . . . photodiode" pp. 1581-1583.
B. F. Levine et al., "High–Detectivity $D^*=1.0\times10^{10}$ cm . . . ", Applied Physics Letters, vol. 53(4), pp. 296-298 (Jul. 25, 1988).
G. H. Döhler, "Physics & Applications of n-i-p-i-Doping . . . ", CRC Critical Reviews in Solid State and Materials Sciences, vol. 13, Issue 12, pp. 97-141 (1987).
K. Ploog et al., "Compositional and doping superlattices . . . ", Advances in Physics, vol. 32(3), pp. 285-359 (1983).

Primary Examiner—Jerome Jackson, Jr.
Attorney, Agent, or Firm—Thomas H. Jones; John R. Manning; Guy M. Miller

[57] ABSTRACT

A new approach to long-wave-infrared (LWIR) technology is based on molecular beam epitaxy (MBE) growth of holeimmobilized doping superlattices (12) in narrow band gap III-V semiconductors, specifically, InAs and InSb. Such superlattices are incorporated into detector structures (10, 10', 10'') suitable for focal plane arrays. The objective of this approach is an LWIR detector possessing the advantages of high detectivity performance, to wavelengths of at least about 16 μm, at operating temperatures of 65K, where long-duration space refrigeration is plausible.

24 Claims, 5 Drawing Sheets

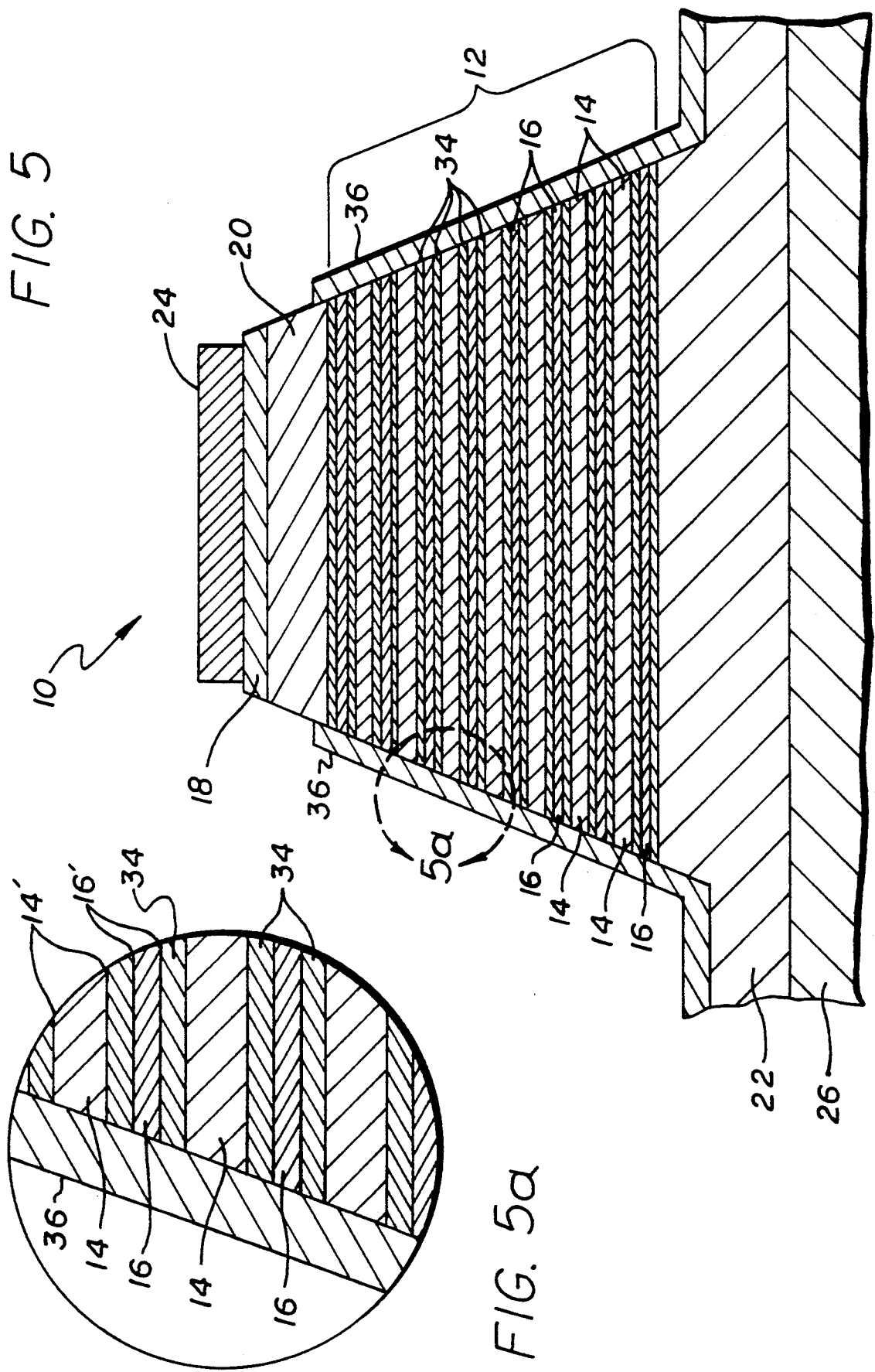

INAS HOLE-IMMOBILIZED DOPING SUPERLATTICE LONG-WAVE-INFRARED DETECTOR

ORIGIN OF THE INVENTION

The invention described herein was made in the performance of work under a NASA contract, and is subject to the provisions of Public Law 96-517 (35 U.S.C. 202) in which the Contractor has elected not to retain title.

TECHNICAL FIELD

The present invention relates to infrared (IR) detectors, and, more particularly, to long wave IR detectors suitable for focal plane arrays.

BACKGROUND ART

There is a major need for producible long-wave-infrared (LWIR) detector arrays in the range of 8 to 18 µm that operate at temperatures of 65K or higher, where space-qualifiable refrigerators are being developed. Considerable effort has been expended to develop II-VI compounds such as HgCdTe to achieve such high performance arrays; however, serious material problems have limited their development into LWIR arrays.

Other established approaches, such as silicon impurity band detector arrays, require cryogenic cooling below 12K. Recently, B. F. Levine et al in Applied Physics Letters, Vol. 53, p. 296-298 (1988) have reported the growth of single pixel quantum well detectors of AlGaAs/GaAs by molecular beam epitaxy (MBE); such detectors have demonstrated good detectivity at 8 µm wavelength (and more recently at longer wavelengths), but require incident radiation to be deflected into the plane of the semiconductor wafer, which complicates their development into focal plane arrays (FPA).

There continues to be a pressing need for LWIR detectors with high detectivity performance at high operating temperatures (>65K) which can be produced into large reliable arrays compatible with silicon or GaAs multiplexer/-readout technology for FPAs.

STATEMENT OF THE INVENTION

Accordingly, it is an object of the invention to provide a long wavelength IR detector with high detectivity performance at temperatures of 65K or higher.

It is an additional object of the invention to provide such a detector in large arrays compatible with silicon or GaAs multiplexer/readout technology for focal plane arrays.

In accordance with the invention, a new kind of LWIR detector is provided, which is based on the growth of narrow band gap III-V semiconductor doping superlattices with their doping profile designed so as to provide long wavelength cutoff and hole conductance immobilized normal to the superlattice. These hole-immobilized doping superlattice (HIDS) structures are incorporated into either photoconductive or photovoltaic detector structures that can be fabricated into arrays compatible with interfacing to silicon or GaAs multiplexer/readout chips for focal plane arrays. These detector arrays are expected to achieve background limited infrared photodetector (BLIP) performance to at least 18 µm at operating temperatures of 65K.

BRIEF DESCRIPTION OF THE DRAWINGS

FIG. 5 is a cross-sectional view of an element of the detector array of FIG. 4 with the addition of a passivation and p-contact layer.

FIG. 5a is an enlargement of a portion of FIG. 5.

DETAILED DESCRIPTION OF THE INVENTION

The doping superlattice (DS) concept has been known for many years and has been considered for a variety of device possibilities, particularly in relation to nipi-type structures requiring individual contacts to the n and p layers. Nipi structures comprise n-type, intrinsic, p-type, and intrinsic layers; see, for example, G. H. Dohler, CRC Critical Review of Solid State Materials Science, Vol. 13, 97-141 (1987). Experimental results have been demonstrated in MBE-grown GaAs nipi structures; however, results on GaAs relate to much shorter wavelengths ($\approx 1$ µm) than of interest in the present application.

The description which follows is presented primarily in terms of InAs as the III-V semiconductor material out of which the detector of the invention is constructed. However, certain other III-V semiconductor materials, such as InSb, may also be employed in the practice of the invention, as described below.

In accordance with the invention, the DS properties may be extended to InAs to achieve LWIR response without the need for multiple n and p contacts. The DS structure, which comprises a plurality of alternating doped layers, may be part of either a photoconductor or photovoltaic detector structure.

Figure 1:
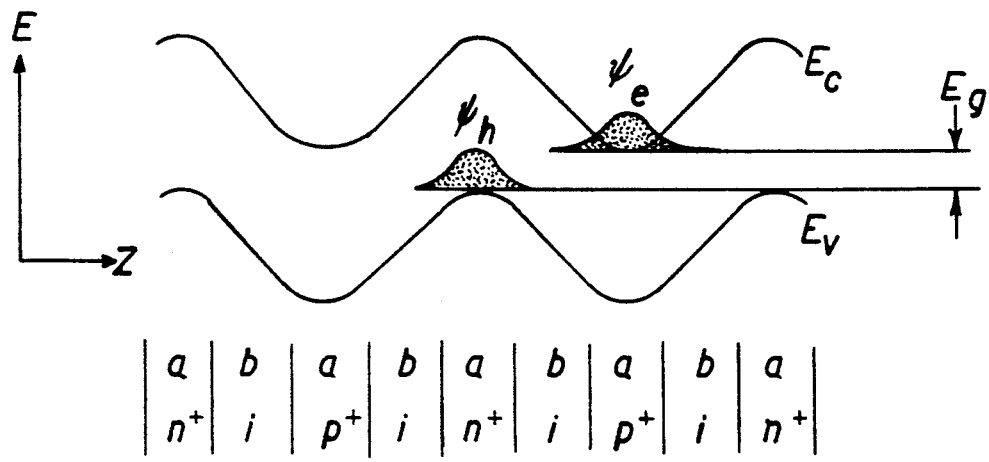
FIG. 1, on coordinates of energy and distance along the z-direction, is a band diagram of a nipi superlattice.

FIG. 1 depicts the basic band diagram of a nipi superlattice. The doping superlattice causes the potential to oscillate between the n+ and p+ layers, creating a reduced energy gap $E_g$ which separates the electron potential valley in the conduction band $E_c$ from the hole potential valley in the valence band $E_v$. This reduced gap is a function of the doping concentrations ($N_D$, $N_A$) and the layer thicknesses (a, b) given at equilibrium by:

$$E_g = E_g^o - (e^2/\epsilon)N_D a(a/4 + b), \quad (1)$$

where $E_g^9 = E_c - E_v$ is the intrinsic band gap, $\epsilon$ is the semiconductor permitivity, and the doner and acceptor concentrations $N_D$, $N_A$ are assumed equal. Eqn. (1) neglects additional terms due to quantization of energy in the potential valleys of the n+ and p+ layers when a is very small. The electron and hole wavefunctions ($\Psi_e$, $\Psi_h$) of the superlattice are spatially separated as shown.

Figure 2:
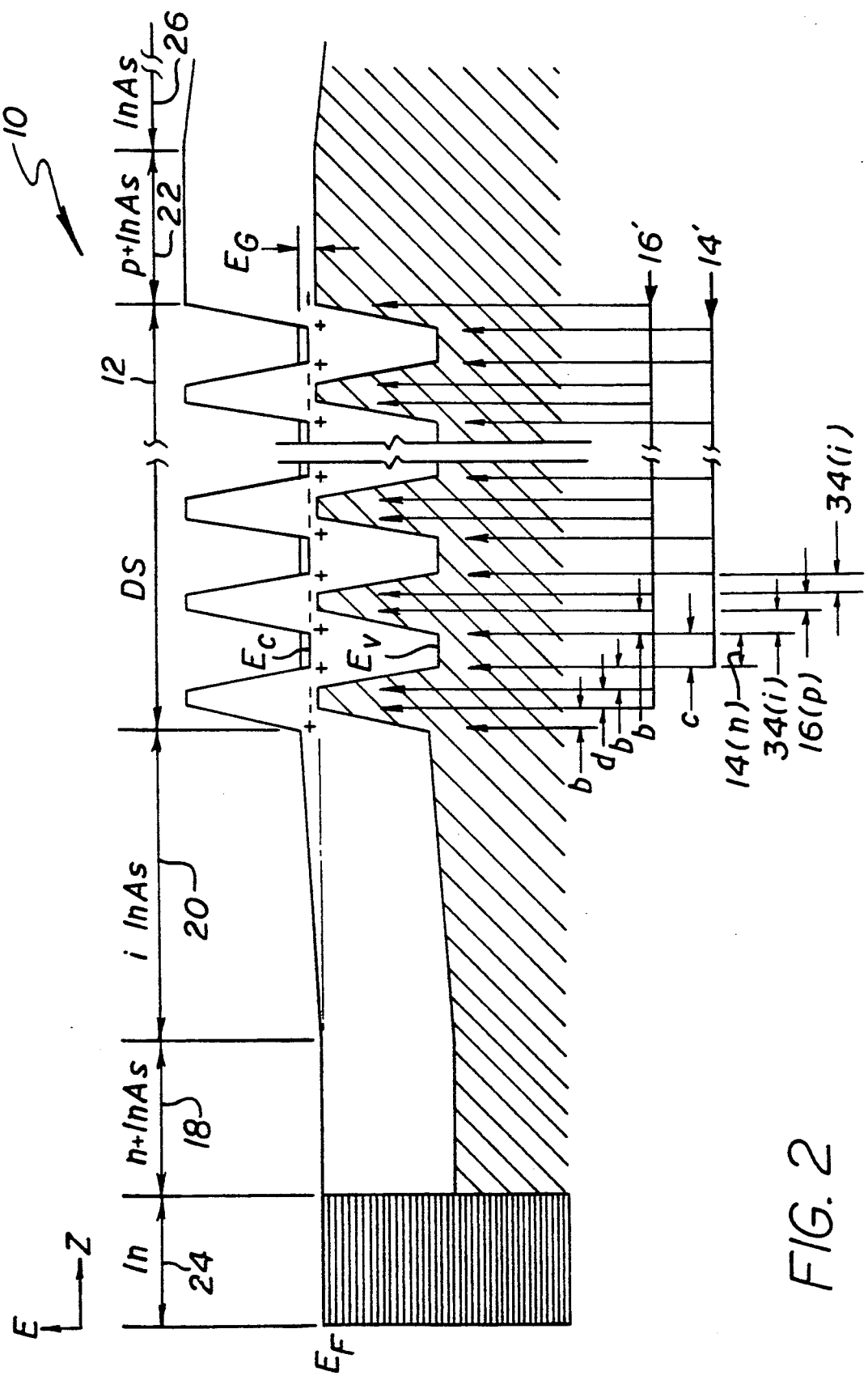
FIG. 2, on coordinates of energy and distance along the z-direction, is a band diagram of a hole-immobilized doping superlattice (HIDS) photovoltaic detector structure incorporating sheet (or "delta") doping in accordance with the invention.

FIG. 2 is a band diagram of a nipi superlattice LWIR detector 10 of the invention, and shows the energy diagram of such a DS structure 12 tailored to impede the hole flow in the z-direction (HIDS structure)—as will be explained below. FIG. 2 also illustrates the use of sheet, or "delta" doping in the DS structure (a→0 in FIG. 1) for improved doping control according to present practice.

The key point of the DS structure is to cause the potential to oscillate between layers 14 and 16, thereby reducing the energy gap $E_g$ which separates the electron potential valley in the conduction band $E_c$ from the hole potential valley in the valence band $E_v$. This reduced gap is a function of doping concentrations and layer thicknesses, and can be tailored to any value from zero to the gap of intrinsic InAs (for the desired wavelength cutoff). That is, the abrupt potential oscillations from the doping profiles create an overlap of the electron and hole wave functions from the adjacent layers (see FIG. 1), thereby allowing transitions across the reduced gap $E_g$. The spatial separation of the electron and hole wave functions reduces the absorption coefficient; however, this effect can be kept within acceptable limits with the abrupt and high doping concentrations possible.

The thickness c of layer 14 determines the width of the electron well and thus the electron ground state energy, which is desired to be maintained small (<80 meV). Thus, it needs to be about 10 nm wide; a thickness range of about 5 to 20 nm is suitably employed in the practice of the invention. This layer thickness also adds to the total width of the tunneling barrier for holes and thus tends to immobilize the layers (i.e., the HIDS concept).

On the other hand, the thickness d of layer 16 should be small to reduce the tunneling barrier for electrons, since it is desired that the conductance of the electrons through the layers be large. If this layer is very narrow (much less than 5 nm), then the holes will be quantized to a ground state energy which becomes significant and adds to the energy gap. This latter effect is not large, since the hole effective mass is large. Possibly more important is the ability to delta-dope Be layers at high concentrations very close together. This constraint may limit the thickness of layer 16 to not much less than about 5 nm. The thickness of this layer may range from 0 to about 5 nm. In the case of d=0, a single delta-doping spike of twice the concentration is used.

The delta-doping levels determine the effective band gap $E_g$ by Eqn. (1), which becomes for the case of delta doping with a→0 and $N_{Da} \to N_s$:

$$E_g = E_g^0 - (e^2/\epsilon)N_s b + E_1(c) \quad (2)$$

where $E_1(c)$ has been added to include the additional quantized ground state energy of electrons (the hole ground state is neglected). $N_s$ is the Si-delta sheet density at interfaces 14' (seen in FIGS. 2 and 5) and assumed to be less than the Be-delta sheet density at interfaces 16'. The gap $E_g$ approaches $E_1$ for values of $N_s$ equal to about $6.6 \times 10^{12}$ cm$^{-2}$. The value of $E_1(c)$ for layer 14 thickness c equal to about 10 nm is about 100 meV. This gap corresponds to a wavelength cutoff ($\lambda_c = 1.24/E_g(eV)$ μm) equal to about 12 μm. Small adjustments in values of $N_a$, b, and c will tailor $E_g$ (and thus $\lambda_c$) according to Eqn. (2) The thickness b of the intrinsic high field layer 34 ranges from about 3 to 10 nm, depending on the minimum spacing permitted by the delta doping.

The HIDS structure 12 shown in FIG. 2 serves multiple purposes. Since it is virtually impossible to match the donor and acceptor concentrations of the n+ and p+ delta-doped layers 14' and 16' precisely, one is left with a large excess of carriers (either electrons or holes) which would defeat its use as a photoconductor. However, the hole conductivity can be greatly impeded in the z-direction because of its already larger effective mass and by deliberately making the hole barrier sufficiently wide. Thus, excess acceptor concentrations may be deliberately used without degrading the performance. This choice turns out to be convenient for other reasons as well. The lighter electron effective mass gives rise to greater quantization energies in the well, which is undesirable (since it would increase $E_g$), but fortunately, this effect is reduced by the wider electron well that coincides with the wider hole barrier. Finally, larger acceptor concentrations can be more readily achieved in MBE growth of InAs, allowing growth of narrower electron barriers as desired.

The device 10 illustrated in FIG. 2 comprises a HIDS photovoltaic detector structure. In this case, a photodiode is formed at the n+/i layers 18/20 contacting the p+ HIDS structure 12. Following growth of the nipi structure 12, an intrinsic layer 20 of InAs is grown thereon for the photovoltaic detector in FIG. 2. This layer 20 is grown to a nominal thickness of about 10 to 200 nm to increase the diode breakdown voltage. Layer 18 of n+ InAs is then formed. This layer 18 is grown to a thickness of about 10 to 100 nm and doped to a concentration greater than $10^{18}$ cm$^{-3}$.

A p+ layer 22 at the opposite side of the HIDS region makes contact to the majority carrier holes. Clearly, in this case, the hole mobility in the z-direction must not be so small as to limit the required detector frequency response. However, this restriction is relaxed in the design discussed in connection with FIG. 5, below. The p+ layer 22 is grown to a thickness of about 50 to 500 nm and is provided with a doping concentration of about 1 to $5 \times 10^{18}$ cm$^{-3}$.

Contact is made to the n+ layer 18 by metal contact 24, and may be made sufficiently compatible with indium bump bonding to multiplexers. The p+ contact layer 22 is grown over a buffer layer 26, which in turn is first grown on a substrate 28 of GaAs or Si (seen in FIG. 4), prior to forming the nipi structure 12 and subsequent layers thereon.

Figure 3:
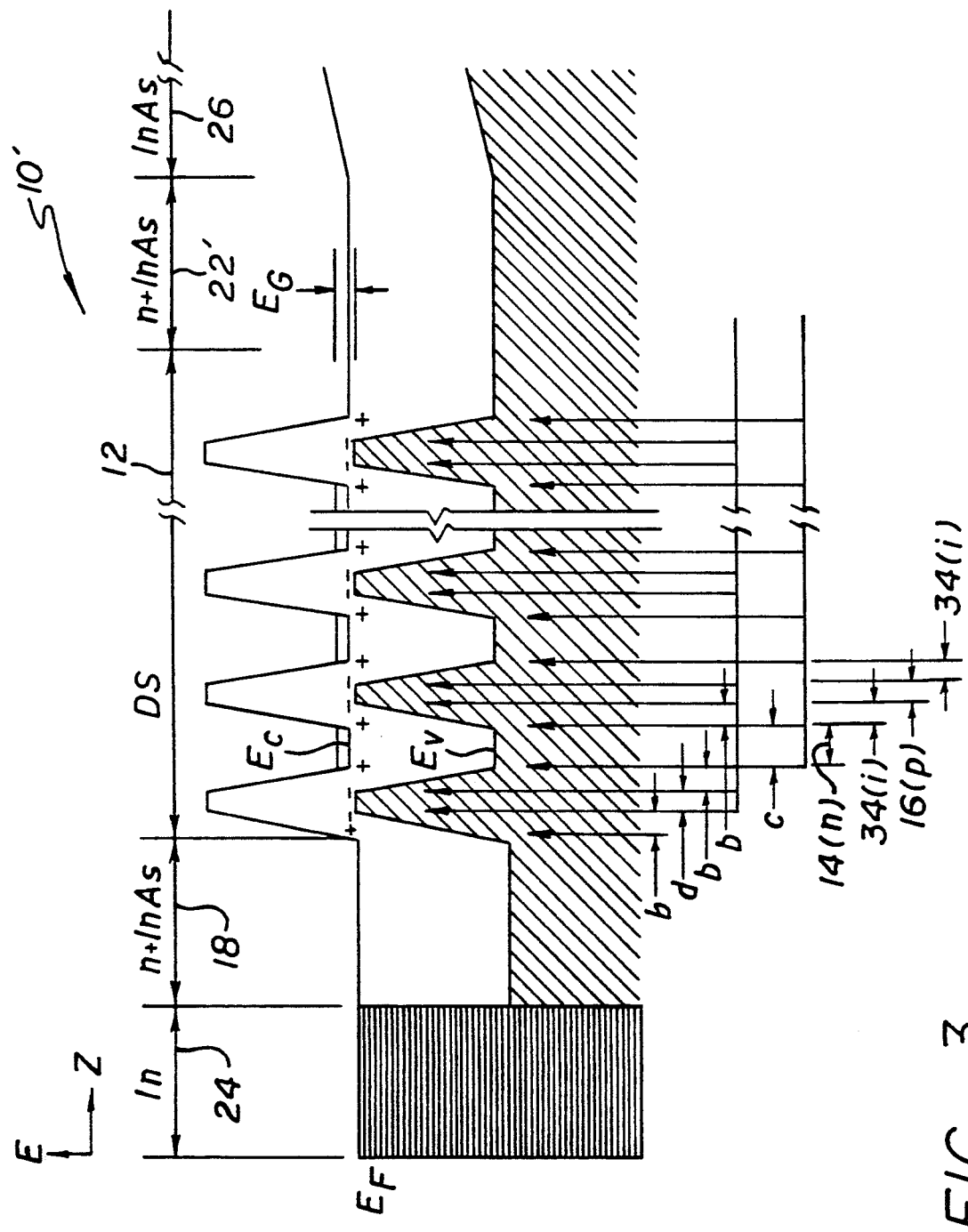
FIG. 3 is similar to FIG. 2, except that it is a band diagram of a HIDS photoconductor detector structure.

FIG. 3 illustrates the energy diagram of a HIDS photoconductor detector structure 10'. In this case, n+ layer 22' provides electron contact to the HIDS photoconductive material and the intrinsic layer 20 of FIG. 2 is omitted. Photons with energy greater than $E_g$ produce electron-hole pairs, but only the electrons are mobile; the holes remain essentially trapped in the layers until recombination with electrons occurs in some lifetime τ. This effect provides a photoconductive gain equal to $\tau/\tau_r$, where $\tau_r$ is the electron transit time. Another advantage of the HIDS structure is that it does not require power to the same extent as prior art photoconductive detectors, due to the fact that the dark current is small because of the immobilized holes.

The HIDS structure 12 has another important property for LWIR photoconductors. Since the Fermi level is at the valence band edge of the superlattice (maxima of $E_v$ oscillations in FIG. 1) because of the excess acceptor concentration, the thermal generation rate is proportional to $\exp(-E_g/kT)$, as compared with $\exp(-E_g/2kT)$ for pure intrinsic detectors. This means that the operating temperature should (ideally) be twice as high for the same performance.

The n+ layer 22,, like p+ layer 20 of FIG. 2, is grown to a thickness of about 50 to 500 nm and is provided with a doping concentration of about 1 to $5 \times 10^{16}$ cm$^{-3}$. The n+ layer 18 has the same dimensions and doping concentration as indicated above in connection with FIG. 2.

Figure 4:
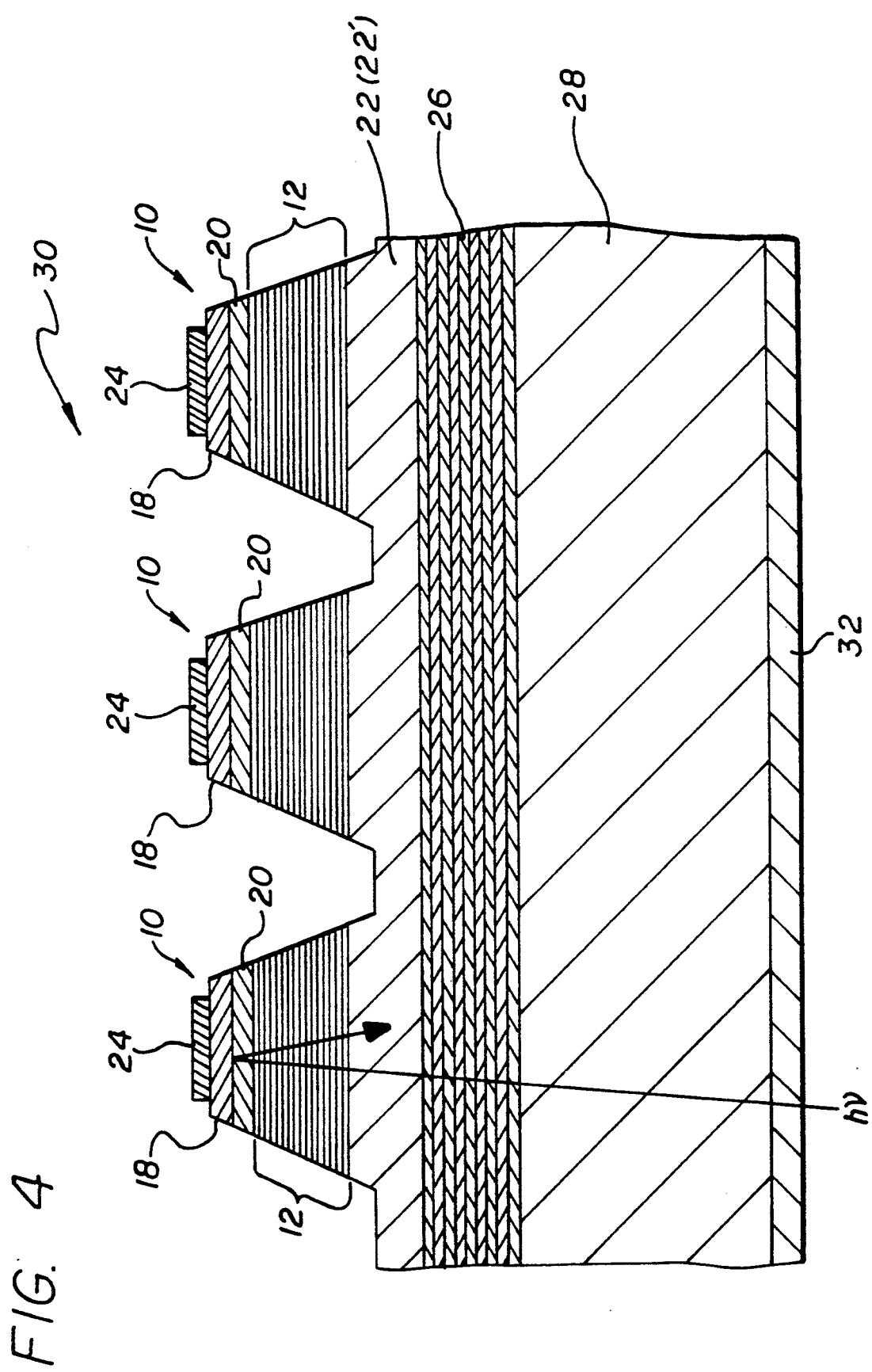
FIG. 4 is a cross-sectional view of a detector array of the invention.

FIG. 4 schematically shows a cross-section of a HIDS detector array 30 grown on GaAs or Si substrate 28. The metal contact 24 serves as a reflector for increasing absorption of IR radiation (hv) from the back side, thereby doubling the absorption distance. Such a structure lends itself to conventional indium bump bonding to silicon multiplexer/readout chips suitable for FPAs.

An anti-reflection layer 32 on the backside of the substrate 28 further increases the absorption of hv. The p+ layer 22 (or n+ layer 22,) provides a common path to a back contact (not shown).

FIG. 5 provides greater detail as to the physical structure of one detector element 12 (three of which are seen in FIG. 4). An overgrowth layer of p+ GaAs 36 is added, which clads a portion of the side of each detector element 12 and covers the p+ InAs layer 22. The overgrowth layer 36 is a passivation layer for blocking electron conduction at the surface and also makes contact to holes through the contact p+ layer 22 (to the common back contact, not shown). If the overgrowth layer 36 is omitted, then the holes would have to travel through the entire structure from the bottom to the top and must not be totally immobilized. Correspondingly, the hole barriers must be narrowed sufficiently to permit hole conduction normal to the layers. Otherwise, a high impedance to the holes could excessively degrade the frequency response. This layer 36 also acts as a blocking contact for n-InAs; however, it maintains contact to the p layers and takes the holes out laterally. Layer 36 is grown to a thickness of about 50 to 500 nm and is doped to at least about $10^{18}$ cm$^{-3}$.

FIG. 5a is an enlargement of a portion of FIG. 5 and shows the details of doping between alternate layers 14 and 6. The intrinsic high-field layers 34 separate the n layers 14 and p layers 16. Delta (or "spike") doping of the layers 14 and 16 is done at the interfaces 14', 16' of that layer adjacent the intrinsic layer 34. Typically, silicon is used for the n-type delta-doping 14', while beryllium is used for the p-type delta-doping 16'.

Figure 6:
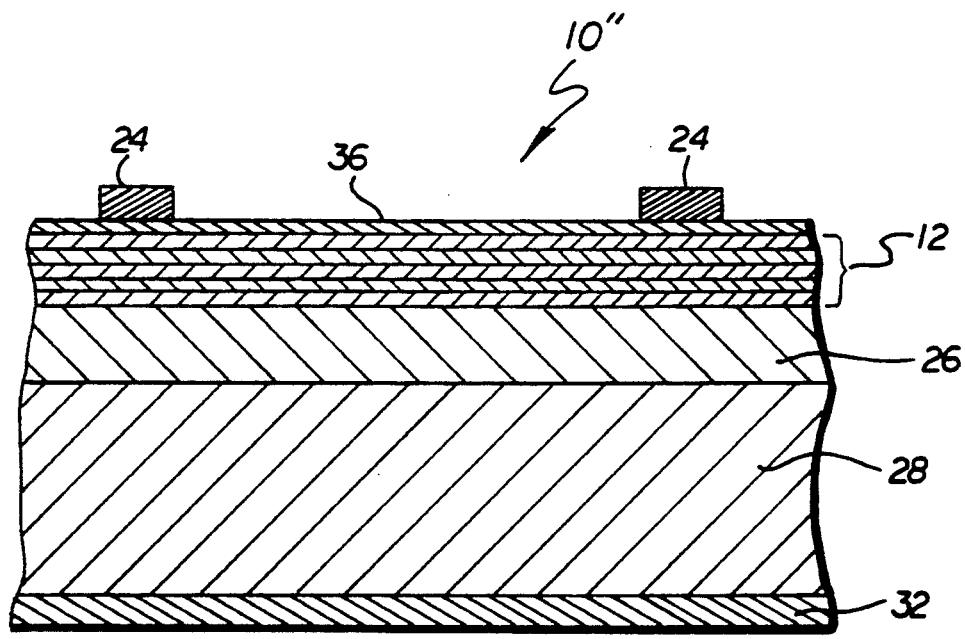
FIG. 6 is a cross-sectional view of an alternate embodiment, depicting lateral contacts for a photoconductor detector structure.

FIG. 6 depicts an alternate embodiment, employing lateral contacts for a photoconductor 10''; such lateral contacts require elimination of the n+ and p+ layers 18 and 2, respectively. A suitable capping layer 36 may optionally be provided to eliminate the effects of a strong n-type surface of InAs (InAs is known to be n-type at the surface). This capping layer, which comprises a wider bandgap material, such as GaAs, serves to passivate the InAs surface by sealing off surface states and is kept as thin as possible to be transparent to electrons. The thickness of the capping layer 36 ranges from about 1 to 5 nm.

In the fabrication of the detector of the invention, semi-insulating GaAs or silicon substrates 28 are employed. Buffer layer 26 serves to relieve strain between the GaAs substrate 28 and the lattice-mismatched InAs back contact layer 22. Typically, about 2 $\mu$m of InAs on GaAs (100) provides a layer that is of comparable or better quality than bulk InAs in terms of dislocation density, background doping, and electrical mobility.

The total thickness of the HIDS structure 12 must not be too thick; if it is greater than the electron diffusion length (which is probably a few $\mu$m for a preferred HIDS structure), then the excess thickness contributes little to the photoresponse. If the thickness of the structure 12 is too thin, then absorption of IR radiation will be reduced accordingly. For a single pass of hv, the quantum efficiency can be about 10% for an optimum HIDS structure. Thus, for the double pass structure shown in FIG. 3, the quantum efficiency would be about 20%. Based on the foregoing considerations, the thickness of the HIDS structure 12 is about 1 to 10 $\mu$m thick, containing about 40 to 400 nipi periods. Preferably, the thickness of the p spacer layers 16 is approximately equal to that of the high-field intrinsic layers 34, about 5 nm, and the thickness of the n spacer layers 14 is about 10 nm.

The level of beryllium doping is about $7 \times 10^{12}$ cm$^{-2}$, while that for silicon is somewhat less. In delta doping, one stops the growth of the host crystal and deposits the dopant under an As$_4$ background until the desired surface concentrations are achieved. After accumulating the appropriate level of Si or Be, growth of the host III-V is continued. The effective width of such doping sheets 14', 16' is about 10 to 20 Å for either acceptors or donors.

It will be appreciated that the foregoing thicknesses are approximate and may be varied to achieve certain desired properties. Also, other III-V semiconductor materials, such as InSb, may be employed in place of InAs.

In the foregoing discussion, the HIDS structure 12 is described as comprising a plurality of n-i-p-i layers. Such a structure is preferred, with the controllability and high concentrations possible with delta doping. However, the n+ —p+ —n+ structure without delta doping may alternatively be employed in certain circumstances.

InAs Doping Superlattice

The key requirement of the doping superlattice is the introduction of alternating layers of high concentrations of dopant atoms in the z-direction as the crystal is grown. Calculations suggest that donor and acceptor doping levels of at least about $10^{19}$ cm$^{-3}$ bulk doping must be achieved. The uniformity of the detector response is also strongly affected by the lateral spatial uniformity of the dopant atoms. Sheet (or "delta") doping of GaAs to levels above $10^{13}$ cm$^{-2}$, equivalent to bulk doping approaching $10^{21}$ cm$^{-3}$, has been demonstrated by K. Ploog et al, Advances in Physics, Vol. 32, pp. 285-359 (1983). These structures show sharp absorption edge turn-on in photoconductors. No degradation of growth interfaces with such high doping levels is observed. However, no corresponding studies have been reported as yet with InAs.

Heteroepitaxial Growth of InAs on GaAs and Si Substrates

The MBE growth characteristics of InAs are quite different than the more familiar AlGaAs materials system which favors elevated growth temperatures for the highest quality electronic material. For InAs, the stoichiometry and dynamic surface reconstruction of the propagating growth are critically important. As the Applicant has observed in work on InAs/GaAs strained layer superlattices, growth on the various transition or tie lines in the surface phase between Group V and Group III stabilized surfaces is critical to good morphology, carrier mobility, and low background doping. Although the lattice mismatch between InAs and Si is greater than 11%, heteroepitaxy has already been achieved. Based on experience in the growth of GaAs on Si, the important parameters which control defect localization near the Si interface include the initial As coverage, the conditioning of the starting Si substrate, the surface step density, and the instantaneous III/V stoichiometry.

What is claimed is:

1. A long-wave infrared detector for operation in the wavelength region of about 8 to 18 μm having a layered nipi structure with electron transport perpendicular to said layered nipi structure, said layered nipi structure comprising a plurality of III-V semiconductor layers to form a doped super-lattice structure, with the p-type layers heavily doped with a first dopant at the interface with intrinsic layers and with the n-type layers heavily doped with a second dopant at the interface with intrinsic layers, said layers comprising a material selected from the group consisting of InAs and InSb, said n-type layers ranging from about 5 to 20 nm thick, said p-type layers ranging from about 1 to 5 nm thick, and said intrinsic layers ranging from about 3 to 10 nm thick, such that holes are substantially immobilized perpendicular to said layers and electrons are conductive.

2. The detector of claim 1 wherein said layered nipi structure is bounded by two major surfaces, each of which is contacted by a contact layer.

3. The detector of claim 1 wherein one of said surfaces is contacted by a layer of p-type III-V semiconductor material and the other of said surfaces is contacted by a layer of n-type material to form a photovoltaic detector.

4. The detector of claim 1 wherein one of said surfaces is contacted by a layer of n-type III-V semiconductor material and the other of said surfaces is contacted by a layer of n-type material to form a photoconductive detector.

5. The detector of claim 1 wherein the total number of nipi periods ranges rom about 40 to 400.

6. A long-wave infrared photovoltaic detector for operation in the wavelength region of about 8 to 18 μm fabricated from III-V semiconductor material selected from the group consisting of InAs and InSb, said detector formed on a semiconductor substrate and comprising at least one detector element, each element comprising:

(a) a buffer layer formed on said substrate to relieve strain between the lattice of said substrate and subsequent layers;

(b) a p+ first contact layer formed on said buffer layer;

(c) a layered nipi structure with electron transport perpendicular to said layered nipi structure and holes substantially immobilized perpendicular to said layered nipi structure, said layered nipi structure comprising a plurality of III-V semiconductor layers to form a doped superlattice structure, with the p-type layers heavily doped with a first dopant at the interface with intrinsic layers and with the n-type layers heavily doped with a second dopant at the interface with intrinsic layers, said n-type layers ranging from about 5 to 20 nm thick, p-type layers ranging from about 1 to 5 nm thick, and said intrinsic layers ranging from about 3 to 10 nm thick;

(d) an intrinsic layer formed on said nipi structure; and (e) an n+ second contact layer formed on said intrinsic layer.

7. The photovoltaic detector of claim 6 wherein said intrinsic layer is about 10 to 200 nm thick.

8. The photovoltaic detector of claim 6 wherein said p+ first contact layer is about 100 to 1,000 nm and is provided with a doping concentration of about 1 to $5 \times 10^{18}$ cm$^{-3}$.

9. The photovoltaic detector of claim 6 wherein said second contact comprises n+ III-V material having a thickness of about 10 to 100 nm and doped to a concentration greater than about $10^{18}$ cm$^{-3}$.

10. The photovoltaic detector of claim 6 further including a layer of p+ wide bandgap material grown over the sides of each detector element, providing contact between each layer of said nipi structure and said p+ first contact layer, while providing a blocking layer to the n-layers of said nipi structure.

11. The photovoltaic detector of claim 10 wherein said p+ wide bandgap material consists essentially of GaAs, grown to a thickness of about 50 to 500 nm and doped to at least about $10^{18}$ cm$^{-3}$.

12. The photovoltaic detector of claim 6 wherein the total number of nipi layers ranges from about 40 to 400.

13. The photovoltaic detector of claim 6 wherein said substrate comprises a material selected from the group consisting of semi-insulating GaAs and Si.

14. The photovoltaic detector of claim 6 comprising a plurality of detector elements to form a detector array.

15. A long-wave infrared photoconductor detector for operation in the wavelength region of about 8 to 18 μm fabricated from III-V semiconductor material selected from the group consisting of InAs and InSb, said detector formed on a semiconductor substrate and comprising at least one detector element, each element comprising:

(a) a buffer layer formed on said substrate to relieve strain between the lattice of said substrate and subsequent layers;

(b) a layered nipi structure with electron transport perpendicular to said layered nipi structure and holes substantially immobilized perpendicular to said layered nipi structure, said layered nipi structure comprising a plurality of III-V semiconductor layers to form a doped superlattice structure, with the p-type layers heavily doped with a first dopant at the interface with intrinsic layers and with the n-type layers heavily doped with a second dopant at the interface with intrinsic layers, said n-type layers ranging from about 5 to 20 nm thick, said p-type layers ranging from about 1 to 5 nm thick, and said intrinsic layers ranging from about 3 to 10 nm thick; and (c) at least one contact layer formed on said intrinsic layer.

16. The photoconductor detector of claim 15 further including:

(a) an n+ first contact layer interposed between said buffer layer and said layered nipi structure, and (b) said at least one contact comprising an n+ second contact layer formed on said intrinsic layer.

17. The photoconductor detector of claim 16 wherein said n+ first contact layer is about 100 to 1,000 nm and is provided with a doping concentration of about 1 to $5 \times 10^{16}$ cm$^{-3}$.

18. The photoconductor detector of claim 16 wherein said second contact comprises n+ III-V material having a thickness of about 10 to 100 nm and doped to a concentration greater than about $10^{18}$ cm$^{-3}$.

19. The photoconductor detector of claim 15 wherein said at least one contact comprises at least one pair of spaced metal contacts, deposited on the surface of said layered nipi structure.

20. The photoconductor detector of claim 19 further including a capping layer of wider bandgap material interposed between said layered nipi structure and said spaced metal contacts, said capping layer grown epitaxially on the surface of said layered nipi structure to a thickness of about 1 to 5 nm.

21. The photoconductor detector of claim 20 wherein said capping layer consists essentially of GaAs.

22. The photoconductor detector of claim 15 wherein the total number of nipi layers ranges from about 40 to 400.

23. The photoconductor detector of claim 15 wherein said substrate comprises a material selected from the group consisting of semi-insulating GaAs and Si.

24. The photoconductor detector of claim 15 comprising a plurality of detector elements to form a detector array.

* * * * *